United States Patent
Cho

(10) Patent No.: US 9,978,440 B2
(45) Date of Patent: May 22, 2018

(54) METHOD OF DETECTING MOST FREQUENTLY ACCESSED ADDRESS OF SEMICONDUCTOR MEMORY BASED ON PROBABILITY INFORMATION

(71) Applicant: SAMSUNG ELECTRONICS CO., LTD., Suwon-si, Gyeonggi-do (KR)

(72) Inventor: Sangyeun Cho, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/529,587

(22) PCT Filed: Nov. 25, 2014

(86) PCT No.: PCT/IB2014/066308
§ 371 (c)(1),
(2) Date: May 25, 2017

(87) PCT Pub. No.: WO2016/083865
PCT Pub. Date: Jun. 2, 2016

(65) Prior Publication Data
US 2017/0263305 A1    Sep. 14, 2017

(51) Int. Cl.
*G11C 7/10* (2006.01)
*G11C 11/408* (2006.01)
*G11C 11/406* (2006.01)

(52) U.S. Cl.
CPC ........ *G11C 11/4082* (2013.01); *G11C 11/406* (2013.01)

(58) Field of Classification Search
CPC .......................... G11C 11/4082; G11C 11/406
See application file for complete search history.

(56) References Cited

U.S. PATENT DOCUMENTS

| | | |
|---|---|---|
| 5,390,308 A | 2/1995 | Ware et al. |
| 7,120,729 B2 | 10/2006 | Gonzalez et al. |
| 7,843,741 B2 | 11/2010 | Jeong et al. |
| 8,060,718 B2 | 11/2011 | Freitas et al. |
| 8,335,887 B2 | 12/2012 | Kim et al. |
| 9,117,544 B2* | 8/2015 | Bains ................ G11C 11/40615 |
| 9,721,643 B2* | 8/2017 | Bains .................. G11C 11/4078 |
| 2005/0055495 A1 | 3/2005 | Vihmalo et al. |
| 2010/0017555 A1 | 1/2010 | Chang et al. |
| 2014/0059287 A1 | 2/2014 | Bains et al. |
| 2014/0177370 A1 | 6/2014 | Halbert et al. |
| 2014/0189228 A1 | 7/2014 | Greenfield et al. |
| 2014/0219043 A1 | 8/2014 | Jones et al. |
| 2014/0281207 A1 | 9/2014 | Mandava et al. |
| 2017/0117030 A1* | 4/2017 | Fisch .................... G11C 11/406 |

FOREIGN PATENT DOCUMENTS

| | | |
|---|---|---|
| KR | 1019990066423 | 8/1999 |
| KR | 1019990073988 | 10/1999 |
| KR | 10-0314149 | 10/2001 |

* cited by examiner

*Primary Examiner* — Pho M Luu
(74) *Attorney, Agent, or Firm* — F. Chau & Associates, LLC

(57) ABSTRACT

A method of managing a semiconductor memory is provided which includes sampling a row address from an access stream on a memory cell array according to a sampling period; determining whether the sampled row address is an address corresponding to a target row which is most frequently accessed, based on probability information; and executing a refresh operation on rows adjacent to the target row.

20 Claims, 16 Drawing Sheets

METHOD OF DETECTING MOST FREQUENTLY ACCESSED ADDRESS OF SEMICONDUCTOR MEMORY BASED ON PROBABILITY INFORMATION

TECHNICAL FIELD

The inventive concepts described herein relate to a semiconductor memory, and more particularly, relate to a method of managing a semiconductor memory.

BACKGROUND ART

A semiconductor memory device may be volatile or nonvolatile. A volatile semiconductor memory device provides high-speed read and write operations but loses data stored therein at power-off. Retaining stored data even at power-off, a nonvolatile semiconductor memory device is used to store contents to be retained regardless of whether or not a power is supplied to the nonvolatile semiconductor memory device.

Examples of volatile memories are a dynamic RAM (DRAM), a synchronous DRAM (SDRAM), a static RAM (SRAM), and so on. Among the volatile memories, some must be periodically refreshed to prevent loss of data. Memory cells connected to word lines adjacent to a frequently accessed word line experience a variation in charge (e.g., charging or discharging) due to an electromagnetic wave, thereby resulting in damage of data. To prevent such row hammering is very important to improve reliability of a semiconductor memory such as DRAM.

DISCLOSURE

Technical Problem

Example embodiments of the inventive concept provide a method of detecting and managing a frequently accessed row address.

Technical Solution

One aspect of embodiments of the inventive concept is directed to provide a method of managing a semiconductor memory, the method comprising sampling a row address from an access stream on a memory cell array according to a sampling period; determining whether the sampled row address is an address corresponding to a target row which is most frequently accessed, based on probability information; and executing a refresh operation on rows adjacent to the target row.

In exemplary embodiments, determining whether the sampled row address is an address corresponding to a target row which is most frequently accessed comprises determining whether the sampled row address is stored in a first buffer; and as a consequence of determining that the sampled row address is stored in the first buffer, increasing a count corresponding to the sampled row address.

In exemplary embodiments, in executing a refresh operation on rows adjacent to the target row, rows adjacent to a target row corresponding to a row address having the greatest count of counts stored in the first buffer are refreshed.

In exemplary embodiments, the method further comprises, as a consequence of determining that the sampled row address is not stored in the first buffer, determining whether the sampled row address is stored in a second buffer.

In exemplary embodiments, as a consequence of determining that the sampled row address is stored in the second buffer, rows adjacent to a row pointed by the sampled row address is not refreshed during a reference period.

In exemplary embodiments, the method further comprises, as a consequence of determining that the sampled row address is not stored in the second buffer, storing the sampled row address in the first buffer according to reference probability.

In exemplary embodiments, storing the sampled row address in the first buffer according to reference probability is performed according to a result of comparing probability generated by a random number generator and the reference probability, and when the probability generated by the random number generator is higher than the reference probability, the row address is stored in the first buffer.

In exemplary embodiments, if the rows adjacent to the target row are refreshed, the target row is registered in the second buffer and is deleted from the first buffer.

In exemplary embodiments, when the first buffer is fully occupied with sampled row addresses, a row address, having a smallest count, from among sampled row addresses stored in the first buffer is deleted or rows adjacent to a row corresponding to a row address, having a greatest count, from among the sampled row addresses stored in the first buffer are refreshed.

In exemplary embodiments, rows adjacent to the target row are refreshed at a point in time when a reference period ends.

In exemplary embodiments, when the second buffer is fully occupied with target row addresses, an oldest one of the target row addresses stored in the second buffer is deleted.

Another aspect of embodiments of the inventive concept is directed to provide a semiconductor memory comprising a memory cell array including a plurality of RAM cells connected to a plurality of word lines; an address buffer configured to receive an access stream on the memory cell array and to extract row addresses corresponding to the plurality of word lines; and a target row refresh (TRR) manager configured to sample the row addresses according to a sampling period, to determine a most frequently accessed target row of the plurality of word lines based on probability information, and to control a refresh operation on rows adjacent to the target row.

In exemplary embodiments, the TRR manager comprises a first buffer configured to store the sampled row address according to reference probability and to store a count associated with the frequency of access to the stored row address; and a second buffer configured to store address information of the target row of row addresses stored in the first buffer.

In exemplary embodiments, the TRR manager compares probability generated by a random number generator with the reference probability, and when the probability generated by the random number generator is higher than the reference probability, the TRR manager stores the sampled row address in the first buffer.

In exemplary embodiments, the count corresponding to the sampled row address increases when the sampled row address is previously stored in the first buffer.

In exemplary embodiments, when the sampled row address is previously stored in the second buffer, rows adjacent to a row corresponding to the sampled row address are not refreshed during a reference period.

Still another aspect of embodiments of the inventive concept is directed to provide a method of managing a semiconductor memory, the method comprising sampling a row address from an access stream from a memory cell array according to a sampling period; determining whether the sampled row address is stored in a first buffer; as a consequence of determining that the sampled row address is stored in the first buffer, increasing a count corresponding to the row address; and refreshing rows adjacent to a target row corresponding to a row address having a greatest count of counts stored in the first buffer.

In exemplary embodiments, the method further comprises, as a consequence of determining that the sampled row address is not stored in the first buffer, determining whether the sampled row address is stored in a second buffer.

In exemplary embodiments, as a consequence of determining that the sampled row address is stored in the second buffer, a row of a memory cell array pointed by the sampled row address is not refreshed during a reference period.

In exemplary embodiments, the method further comprises, as a consequence of determining that the sampled row address is not stored in the second buffer, storing the sampled row address in the first buffer according to reference probability.

Advantageous Effects

According to example embodiments of the inventive concept, it is possible to manage a most frequently accessed row address based on probability information. All accessed addresses are not managed, but a row address is managed based on probability information, thereby making it possible to simplify algorithm and to efficiently manage a semiconductor memory with less resource.

DESCRIPTION OF DRAWINGS

The above and other objects and features will become apparent from the following description with reference to the following figures, wherein like reference numerals refer to like parts throughout the various figures unless otherwise specified, and wherein.

BEST MODE

Figure 1:
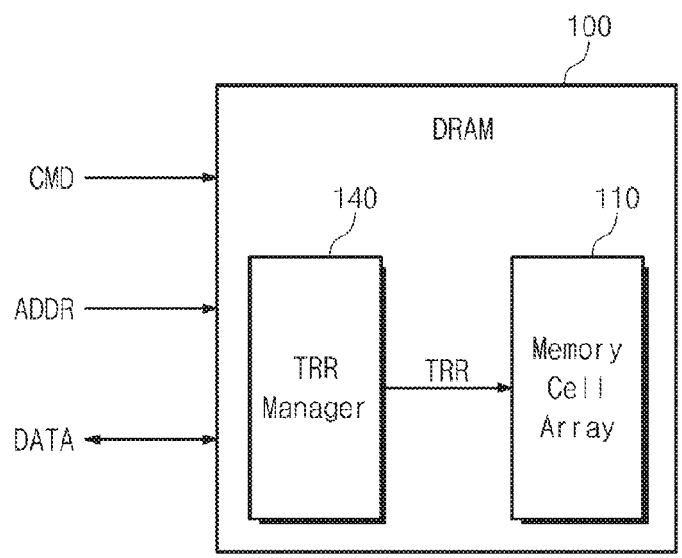
FIG. 1 is a block diagram schematically illustrating a semiconductor memory according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a semiconductor memory according to an embodiment of the inventive concept. Referring to FIG. 1, a semiconductor memory 100 may be a DRAM. However, the inventive concept is not limited thereto. For example, the spirit and feature of the inventive concept may be applied to all memories that necessitate a refresh operation in which information is read from a memory and the read information is immediately rewritten at the memory.

The semiconductor memory 100 may be coupled with an external memory controller (not shown). The semiconductor memory 100 receives a command CMD and an address ADDR from the external memory controller to access a memory cell array 110. The semiconductor memory 100 exchanges data with the memory controller through a data node or a data line.

The semiconductor memory 100 according to an embodiment of the inventive concept contains the memory cell array 110 and a target row refresh (TRR) manager 140.

The memory cell array 110 includes a plurality of memory cells that are connected to a plurality of word lines and a plurality of bit lines.

The TRR manager 140 performs a target row refresh (TRR) operation with respect to the memory cell array 110. The TRR operation means that a refresh operation is carried out with respect to memory cells of a word line, adjacent to a frequently accessed word line, of word lines of the memory cell array 110. In the DRAM, a specific word line of the memory cell array 110 is frequently and iteratively accessed. This results from a random access characteristic of the DRAM or is an unprecedented access pattern due to a hacker-made malicious code. If a specific word line of the memory cell array 110 is iteratively accessed, capacitors of memory cells of word lines adjacent to the specific word line are influenced by an electromagnetic wave that is generated due to toggling of the specific word line iteratively accessed. For example, data is damaged because electrons flow into or discharged from capacitors of memory cells of word lines adjacent to the specific word line iteratively accessed.

The TRR manager 140 performs a TRR operation with respect to a frequently accessed word line to prevent the above-described row hammering. For example, the TRR manager 140 samples a row address from an access stream on the memory cell array 110.

The TRR manager 140 collects and manages information on a frequently accessed row address based on the sampled row address. For example, generated is table information on how frequently the sampled row address is accessed, during a period where a refresh operation is performed. The TRR operation is carried out with respect to a target row of which the frequency of access is greatest. That is, a refresh operation is executed with respect to memory cells connected to rows adjacent to the target row.

With an embodiment of the inventive concept, a frequently accessed row address may be managed based on probability, not all accesses to the memory cell array 110 of the semiconductor memory 100. Thus, algorithm for managing a memory is simplified, and a frequently accessed memory address is searched with high probability using less resource. Below, a method of detecting and managing a frequently accessed row address according to probability will be described.

Figure 2:
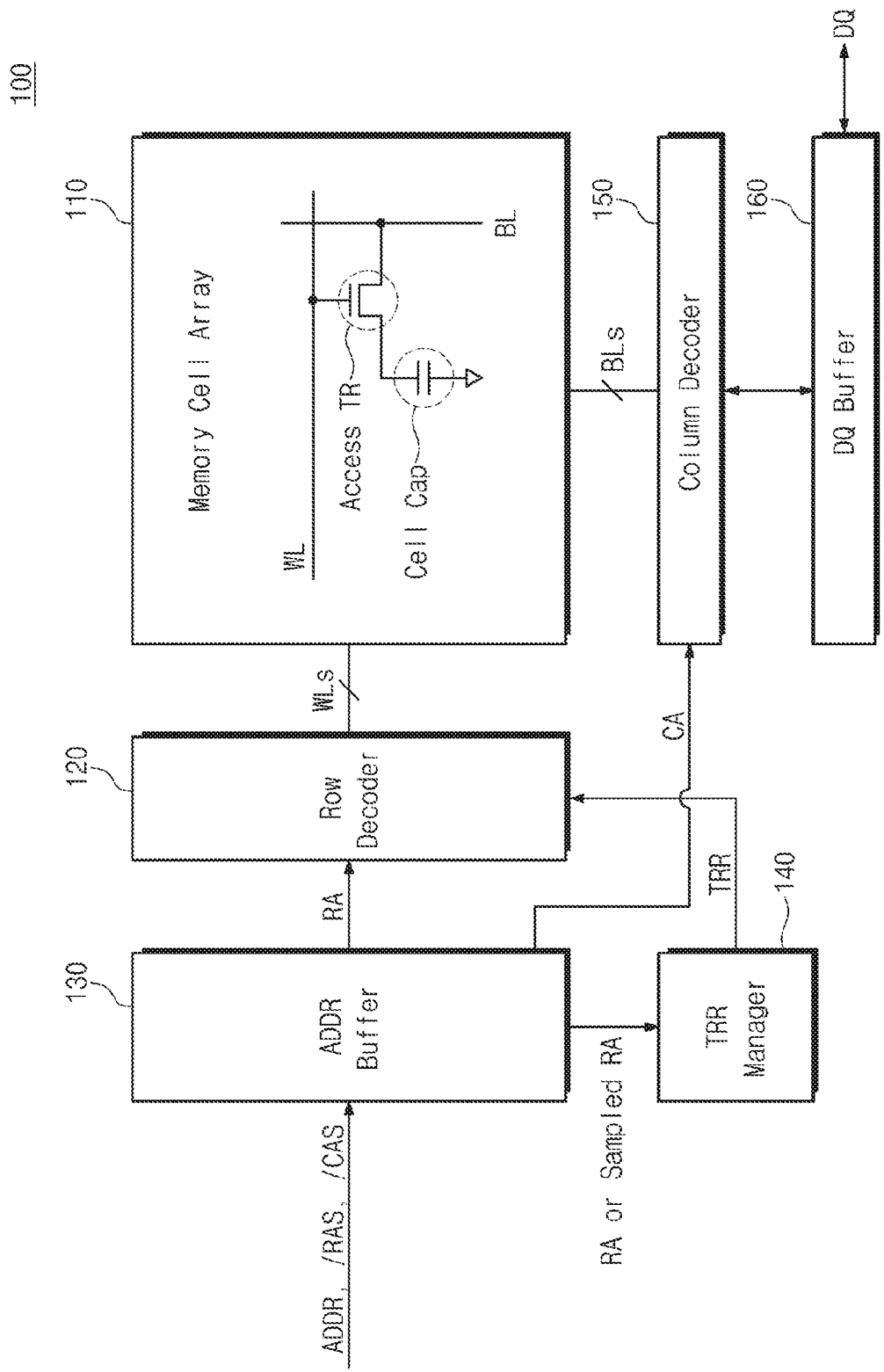
FIG. 2 is a block diagram schematically illustrating a semiconductor memory according to an embodiment of the inventive concept.

FIG. 2 is a block diagram schematically illustrating a semiconductor memory according to an embodiment of the inventive concept. For example, a semiconductor memory 100 is a DRAM. However, the inventive concept is not limited thereto. As described above, the spirit and feature of the inventive concept may be applied to all memories that necessitate a refresh operation for preserving data.

Referring to FIG. 2, a DRAM 100 contains a memory cell array 110, a row decoder 120, an address buffer 130, a TRR manager 140, a column decoder 150, and a DQ buffer 160.

The memory cell array 110 includes a plurality of memory cells that are disposed in a row direction and a column direction and are connected to a plurality of word lines and a plurality of bit lines. Each memory cell contains a cell capacitor and an access transistor. In each memory cell, a gate terminal of the access transistor is connected to a word line extending in the row direction, one end of the access transistor is connected to a bit line or a complementary bit line extending in the column direction, and the other end thereof is connected to the cell capacitor.

The row decoder 120 selects a word line connected to a memory cell to be accessed in response to an input address ADDR. The row decoder 120 decodes the input address ADDR to enable a word line. The row decoder 120 receives a command TRR for a TRR operation and performs a TRR operation with respect to a most frequently accessed target row (i.e., a target word line). With the TRR operation, memory cells connected to word lines adjacent to the target word line are refreshed.

The address buffer 130 temporarily stores an access stream (i.e., an address) transferred from an external device.

The address buffer 130 receives a column address strobe signal /CAS and a row address strobe signal /RAS. The address buffer 130 generates a row address RA and a column address CA, based on the received access stream /CAS and /RAS. The address buffer 130 provides the row address RA and the column address CA to the row decoder 120 and the column decoder 150, respectively. Through the address buffer 130, an address ADD is converted from an external signaling way into an internal signaling way of the semiconductor memory 100.

The TRR manager 140 receives a row address RA or a sampled row address from the address buffer 130.

Receiving the row address RA, the TRR manager 140 samples the received row address RA. A row address may be sampled whenever the memory cell array 110 is accessed k times. To sample a row address the TRR manager 140 manages is to simplify management algorithm and to improve efficiency. A value of "k" is a fixed value or is randomly set by a user according to a system state. For example, if load of a memory system including the semiconductor memory 100 is great, the value of "k" is increased to reduce the number of row addresses to be sampled during the same period, and vice versa.

The TRR manager 140 determines whether a sampled row address is a frequently accessed row address. For example, the TRR manager 140 may have a first buffer to manage an accessed row address. With an embodiment of the inventive concept, all sampled row addresses may not be stored in the first buffer. For example, a row address sampled according to random probability may be stored in the first buffer.

The TRR manager 140 increases a count corresponding to a row address according to the frequency of access. A control signal TRR is generated to perform a TRR operation on a row address (i.e., a target row) having the greatest count. A refresh operation need to be executed because the chance that rows adjacent to the target row frequently accessed suffer from the row hammering is high. Receiving the TRR signal, the row decoder 120 selects a word line corresponding to the target row to execute the TRR operation on the target row.

The TRR manager 140 may further include a second buffer to manage a most frequently accessed target row, after executing the TRR operation. Since rows adjacent to the target row are refreshed, the TRR operation on the target row needs not to be considered for a while. A configuration needed to manage a frequently accessed row address using the first and second buffers will be more fully described with reference to FIGS. 3 to 6.

The DQ buffer 160 temporarily stores program data DQ provided from the external device and sends it to a sense amplifier (not shown). The DQ buffer 160 temporarily stores read data received from the sense amplifier and outputs it to the external device.

If the TRR manager 140 receives a sampled row address, the address buffer 130 not only generates a row address RA and a column address CA based on an access stream, /CAS, and /RAS, but it also executes sampling on a row address. Instead, the TRR manager 140 does not sample the access stream.

With an embodiment of the inventive concept, it is possible to manage a most frequently accessed row address based on probability information. All accessed addresses are not managed, but a row address is managed based on probability information, thereby making it possible to simplify algorithm and to efficiently manage a semiconductor memory with less resource. The row hammering of the DRAM is prevented by performing a TRR operation on a row address that is viewed as being most frequently accessed.

Figure 3:
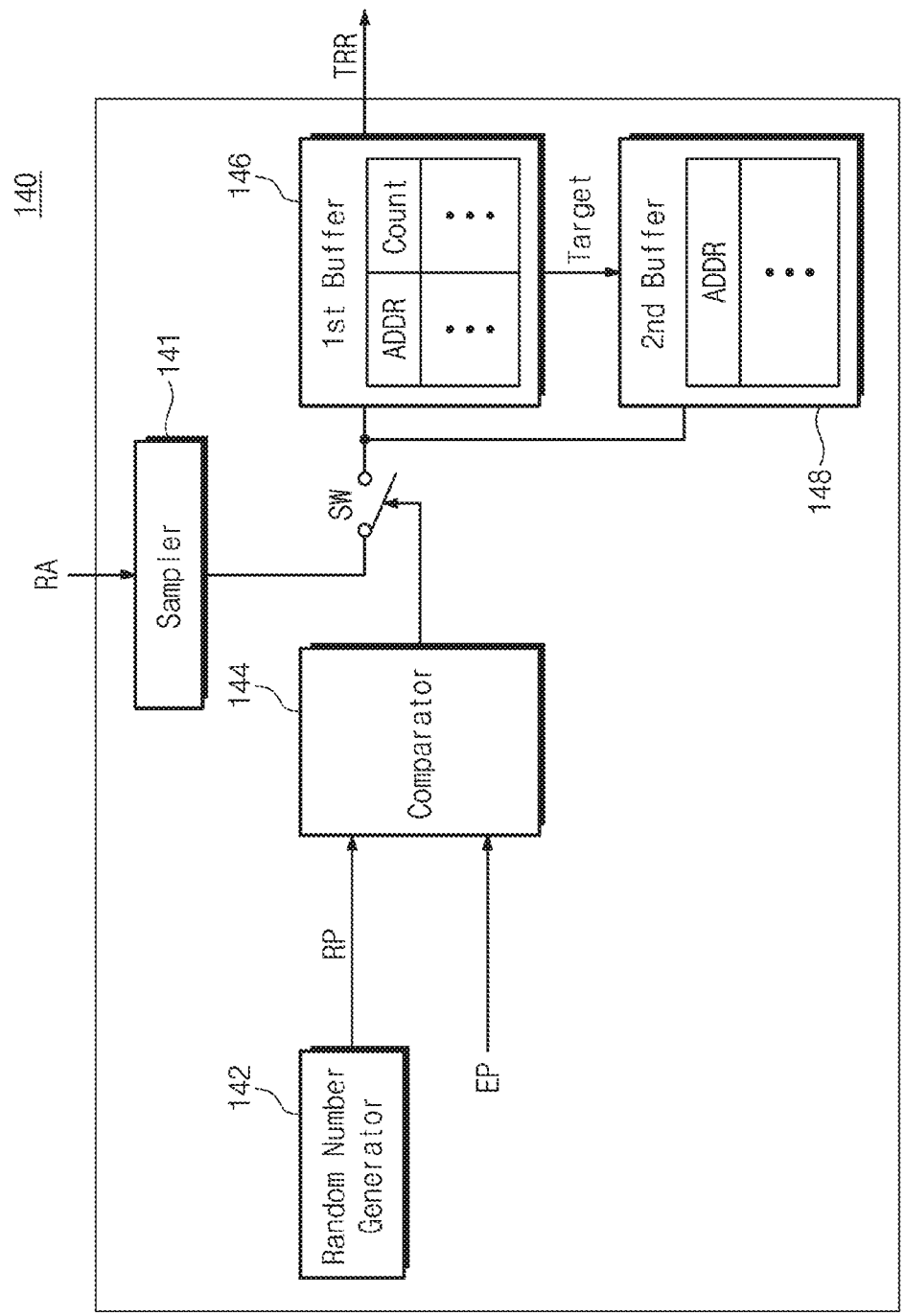
FIG. 3 is a block diagram schematically illustrating a TRR manager 140 according to an embodiment of the inventive concept.

FIG. 3 is a block diagram schematically illustrating a TRR manager 140 according to an embodiment of the inventive concept. In FIG. 3, an embodiment of the inventive concept is exemplified as a TRR manager 140 executes sampling on an access stream. Referring to FIG. 3, the TRR manager 140 contains a sampler 141, a random number generator 142, a comparator 144, a first buffer 146, and a second buffer 148.

The sampler 141 samples an access stream an address buffer 130 receives. For example, the sampler 141 may perform sampling whenever a memory cell array 110 is accessed k times. A value of "k" is a fixed value, is automatically set according to a system state, or is randomly set by a user according to the system state. For example, if load of a memory system including the semiconductor memory 100 is great, the value of "k" is increased to reduce the number of row addresses to be sampled during the same period. In contrast, if load of a memory system including the semiconductor memory 100 is small, the value of "k" is decreased to increase the number of row addresses to be sampled during the same period.

The random number generator 142 generates probability for determining whether a sampled row address is a target to be managed as a frequently accessed row address. Random probability RP generated by the random number generator 142 may be set to be very small. The random probability RP may increase to widen a range of row addresses to be managed, and vice versa.

The comparator 144 compares the random probability RP and entrance probability EP. If the random probability RP is higher than entrance probability EP, a switch SW connects the sampler 141 to the first buffer 146 according to a control of the TRR manager 140. In this case, a sampled row address may be stored in the first buffer 146. If the random probability RP is lower than entrance probability EP, the TRR manager 140 controls the switch SW such that a sampled row address is not stored in the first buffer 146. The switch is exemplary. The switch may be variously configured such that a comparison result of the comparator 144 is applied when a sampled row address is stored in the first buffer 146.

The row address information that count value is the lowest may be deleted if the random probability RP is higher than entrance probability EP and the first buffer 146 is full. Newly sampled row address information and count may be stored at a deleted row address information entry. At this time, a count is 1. In other exemplary embodiments, if the random probability RP is higher than entrance probability EP and the first buffer 146 is full, a TRR operation may be performed with respect to a row address having the greatest count.

The first buffer 146 stores table information to manage a frequently accessed row address. For example, the first buffer 146 stores an address and a count corresponding to the frequency of access to the address. A count stored in the first buffer 146 is utilized to perform the TRR operation on a frequently accessed target row. For example, at a point in time when a reference period W ends, the TRR operation may be carried out with respect a target row having the greatest count stored in the first buffer 146. The reference period W is obtained by dividing an auto-refresh cycle on a memory cell array by the number of TRR operations executed during the auto-refresh cycle. The TRR manager 140 transmits a control signal TRR to a row decoder 120 (refer to FIG. 2). The row decoder 120 selects a word line corresponding to a target row to perform the TRR operation.

After the TRR operation is executed, address information on the target row is transferred to the second buffer 148. At this time, a target row address stored in the first buffer 146 is deleted.

The second buffer 148 stores information associated with a row address where the TRR operation is executed. The row address where the TRR operation is executed is an address that is most frequently accessed during the reference period W. Since rows adjacent to the target row are refreshed as described above, the TRR operation (i.e. a refresh operation on the rows adjacent to the target row) on the target row need not to be considered for a while. The opportunity to perform a TRR operation on a most frequently accessed row address of row addresses stored in the first buffer 146 except for a row address stored in the second buffer 148 may be granted.

Figure 4:
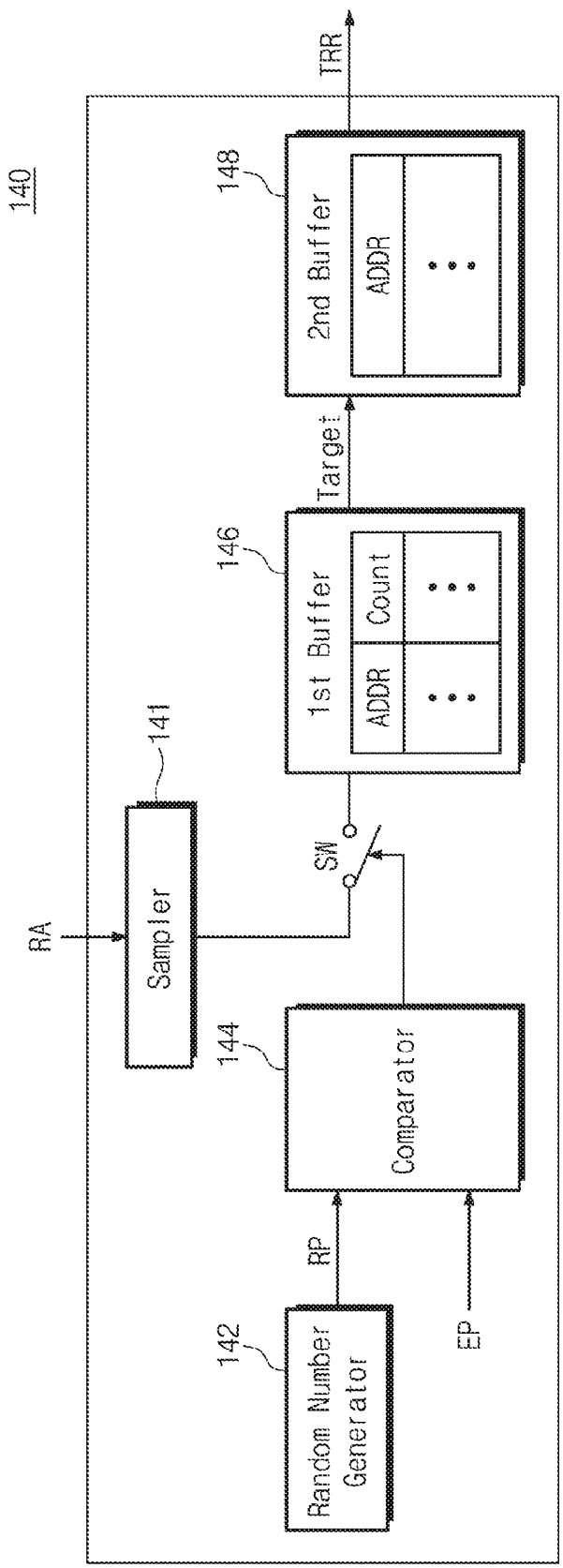
FIG. 4 is a block diagram schematically illustrating a TRR manager 140 according to another embodiment of the inventive concept.

FIG. 4 is a block diagram schematically illustrating a TRR manager 140 according to another embodiment of the inventive concept. In FIG. 4, a description duplicated with that of FIG. 3 is omitted.

Referring to FIG. 4, information associated with a most frequently accessed target row address of row addresses stored in a first buffer 146 is transferred to a second buffer 148 at a point in time when a reference period W ends. If information associated with a target row address is stored in the second buffer 148, information associated with the target row address stored in the first buffer 146 is deleted. A TRR manager 140 provides a row decoder 120 (refer to FIG. 2) with a control signal TRR such that there is performed a TRR operation on a target row address stored in the second buffer 148.

Figure 5:
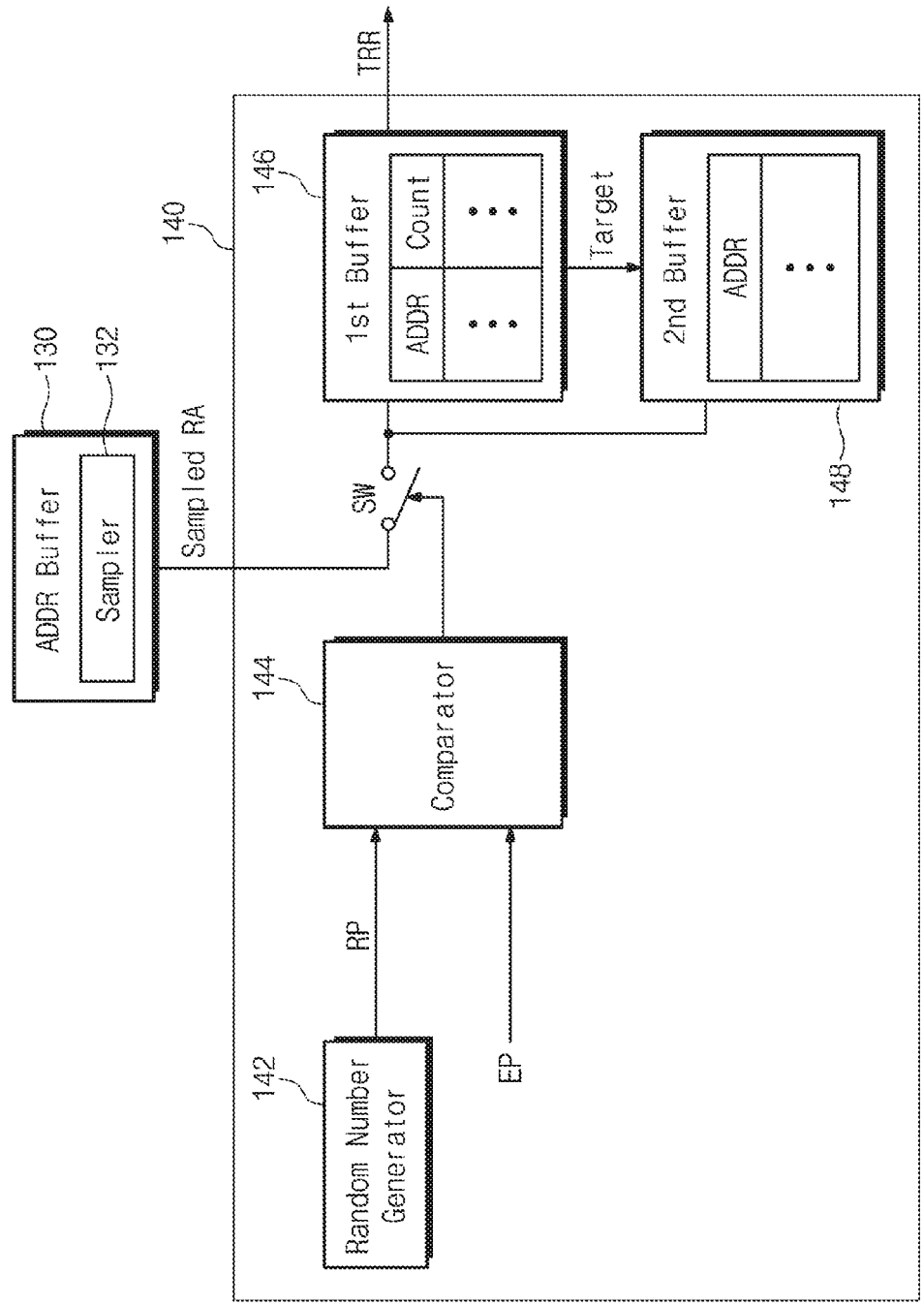
FIG. 5 is a block diagram schematically illustrating a TRR manager 140 according to still another embodiment of the inventive concept.

FIG. 5 is a block diagram schematically illustrating a TRR manager 140 according to still another embodiment of the inventive concept. FIG. 5 shows an embodiment in which sampling on an access stream is made in an address buffer 130. A sampler 132 is implemented within the address buffer 130. The remaining configuration and function are similar to those of FIG. 3, and a description thereof is thus omitted.

Figure 6:
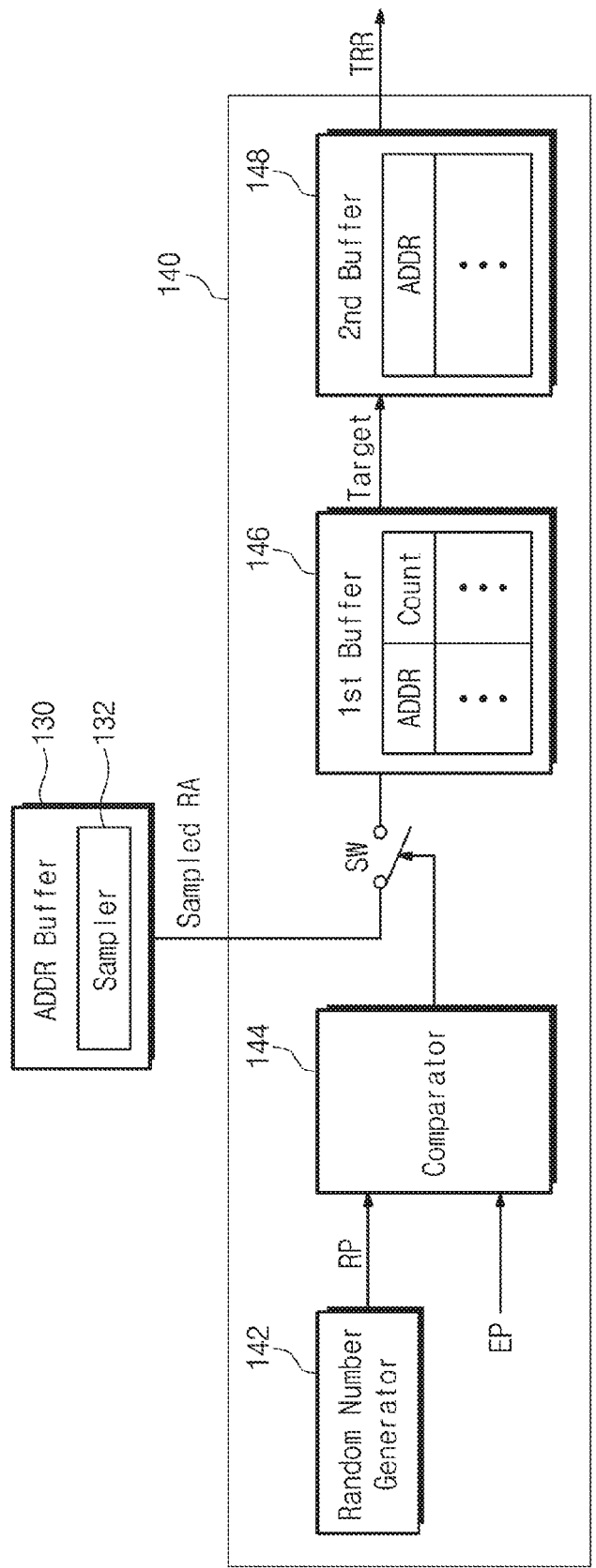
FIG. 6 is a block diagram schematically illustrating a TRR manager 140 according to a further embodiment of the inventive concept.

FIG. 6 is a block diagram schematically illustrating a TRR manager 140 according to a further embodiment of the inventive concept. FIG. 6 shows an embodiment in which sampling on an access stream is made in an address buffer 130. Information associated with a most frequently accessed target row address of row addresses stored in a first buffer 146 is transferred to a second buffer 148 at a point in time when a reference period W ends. If information associated with a target row address is stored in the second buffer 148, information associated with the target row address stored in the first buffer 146 is deleted. A TRR manager 140 provides a row decoder 120 (refer to FIG. 2) with a control signal TRR such that there is performed a TRR operation on a target row address stored in the second buffer 148. The remaining configuration and function are similar to those of FIG. 4, and a description thereof is thus omitted.

Figure 7:
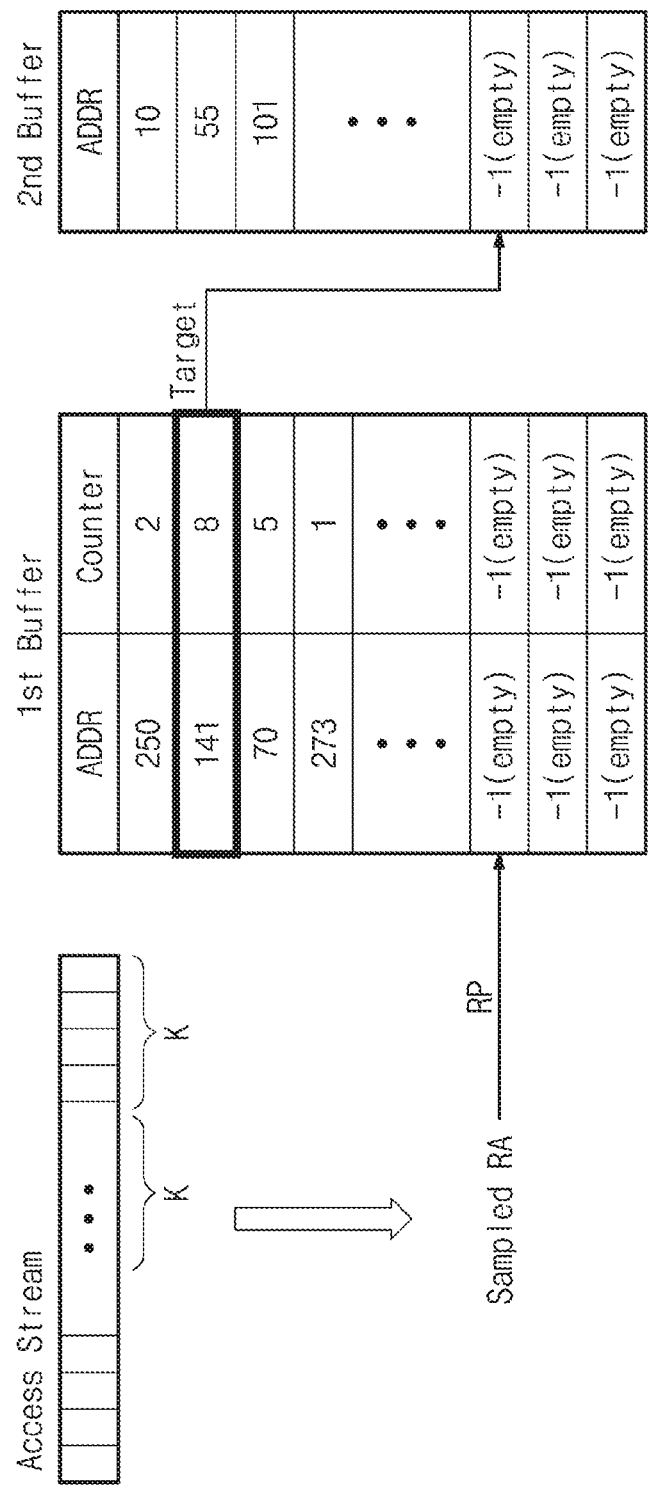
FIG. 7 is a diagram schematically illustrating the procedure for a TRR manager managing a target row address, according to an embodiment of the inventive concept.

FIG. 7 is a diagram schematically illustrating the procedure for a TRR manager managing a target row address, according to an embodiment of the inventive concept.

Referring to FIG. 7, a row address is sampled whenever an access is requested k times with respect to an access stream. As described above, sampling may be executed at an address buffer 130 (refer to FIG. 2) or a TRR manager 140. A value of "k" is a fixed value or is randomly set by a user according to a system state. For example, if load of a memory system including the semiconductor memory 100 is great, the value of "k" is increased to reduce the number of row addresses to be sampled during the same period, and vice versa.

Various operations may be performed according to whether a sampled row address is stored in a first buffer or in a second buffer. There may be considered various cases: 1) a sampled row address is not stored in the first buffer and the second buffer, 2) a sampled row address is stored in the first buffer, and 3) a sampled row address is stored in the second buffer.

Being not stored in the first buffer and the second buffer, the sampled row address is stored in the first buffer 146 (refer to FIG. 3) according to random probability RP. If the first buffer 146 is not full, an empty space has a state where a number (e.g., 0 or −1) different from stored address and count values is stored. If the first buffer 146 is full, information associated with an address, having the smallest count, from among addresses stored in the first buffer 146 is deleted. The deleted space is used to store information associated with a newly sampled row address. Or, if the first buffer 146 is full, a TRR operation is performed with respect to an address, having the greatest count, from among addresses stored in the first buffer 146. The information associated with the address having the greatest count value is deleted from the first buffer 146, and stored in the second buffer 148 (refer to FIG. 3).

The TRR operation is carried out with respect to an address (i.e., a target row address), having the greatest count, from among addresses stored in the first buffer 146. The TRR operation is performed every reference period W. That is, the shorter the reference period W, the shorter the period of the TRR operation. This is effective to prevent row hammering, but load of a system increases. In contrast, the longer the reference period W, the longer the period of the TRR operation. This is insufficient to prevent row hammering, but load of a system decreases.

After the TRR operation is executed, information associated with the target row address is stored in the second buffer 148, and information associated with the target row address stored in the first buffer 146 is deleted. The target row address is stored in any empty space of the second buffer 148. If the second buffer 148 is full, information associated with the oldest target row address is deleted and information associated with a new target row address is stored in the space where information associated with the oldest target row address is deleted.

Addresses stored in the second buffer 148 may be addresses that are viewed as being most frequently accessed of late. Now that word lines adjacent to a word line corresponding to a target row address are recently refreshed, TRR operations on addresses stored in the second buffer 148 need not be considered for a while. Time when target row addresses are stored in the second buffer 148 is fixed or is randomly set. For example, target row addresses may be stored in the second buffer 148 during time corresponding to N times the reference period W (N being a natural number). This means that the TRR operation on target row addresses stored in the second buffer 148 is not performed during time corresponding to N times the reference period W. Or, time when target row addresses are stored is not fixed, but the oldest target address is deleted from the first buffer 146 whenever updated with new target addresses.

Second, in case a sampled row address is previously stored in the first buffer 146, a count corresponding to the sampled row address increases.

Third, in case a sampled row address is previously stored in the second buffer 148, a TRR operation on a target row is not considered during predetermined time because the TRR operation on the target row address is recently performed. That is, the sampled row address is passed.

With an embodiment of the inventive concept, it is possible to manage a most frequently accessed row address based on probability information. All accessed addresses are not managed, but a row address is managed based on probability information, thereby making it possible to simplify algorithm and to efficiently manage a semiconductor memory with less resource. The row hammering of the DRAM is prevented by performing a TRR operation on a row address that is viewed as being most frequently accessed.

Figure 8:
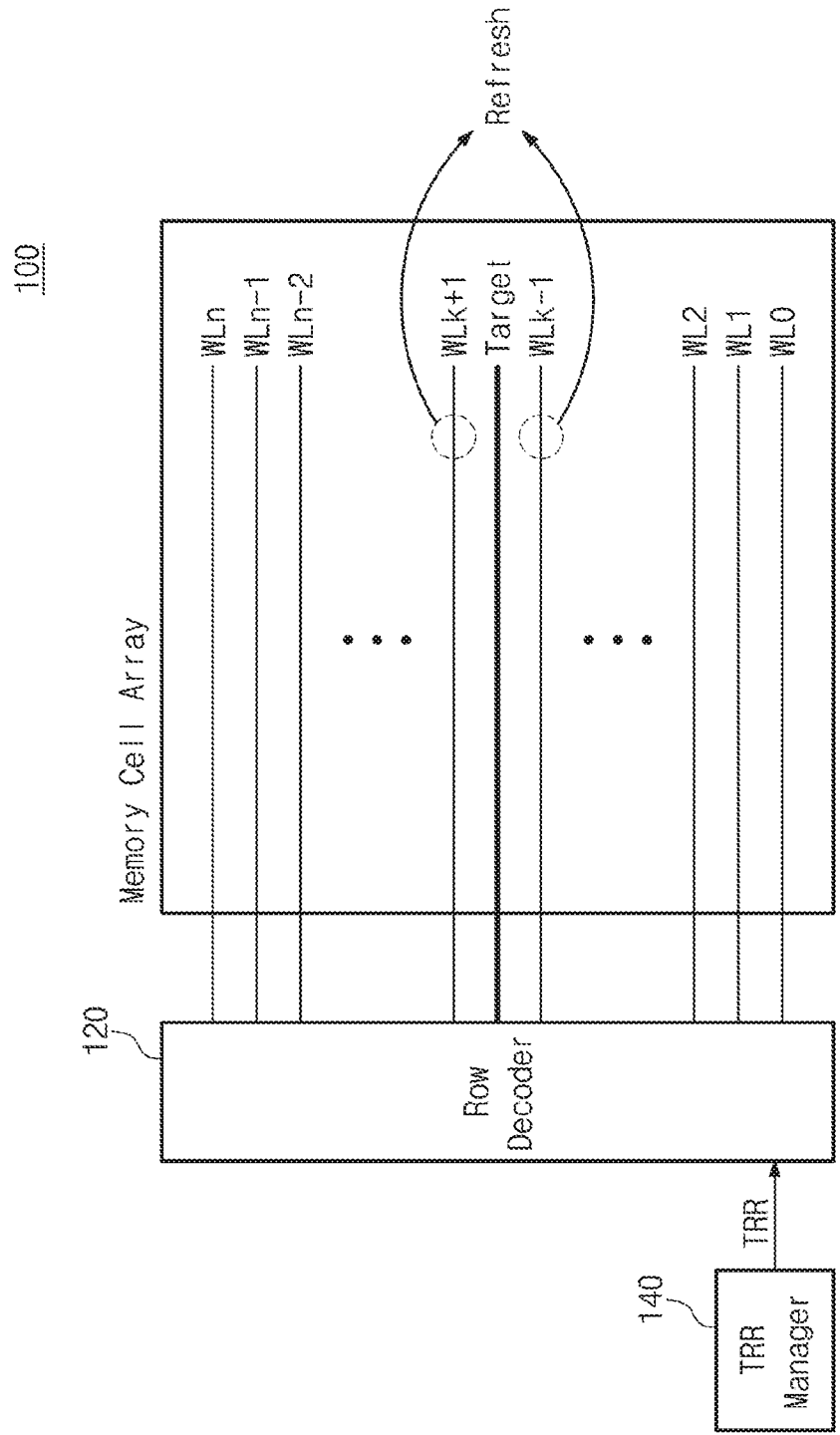
FIG. 8 is a diagram schematically illustrating a target row refresh (TRR) operation on a most frequently accessed target row address, according to an embodiment of the inventive concept.

FIG. 8 is a diagram schematically illustrating a target row refresh (TRR) operation on a most frequently accessed target row address, according to an embodiment of the inventive concept.

Referring to FIG. 8, a TRR operation on a target row of a memory cell array 110 is performed according to the above-described way. Refreshed are word lines WLk+1 and WLk−1 just adjacent to a word line corresponding to a most frequently accessed target row address. A further operation is no longer carried out after the TRR operation is performed with respect to a word line corresponding to a target row. As described above, after predetermined time elapses or in case a target row address is the oldest row address of target row addresses stored in a second buffer 148 (refer to FIG. 3), information associated with a target row address stored in the second buffer 148 is deleted from the second buffer 148. Whether a row address deleted from the second buffer 148 is a frequently accessed row address may be again determined.

Figure 9:
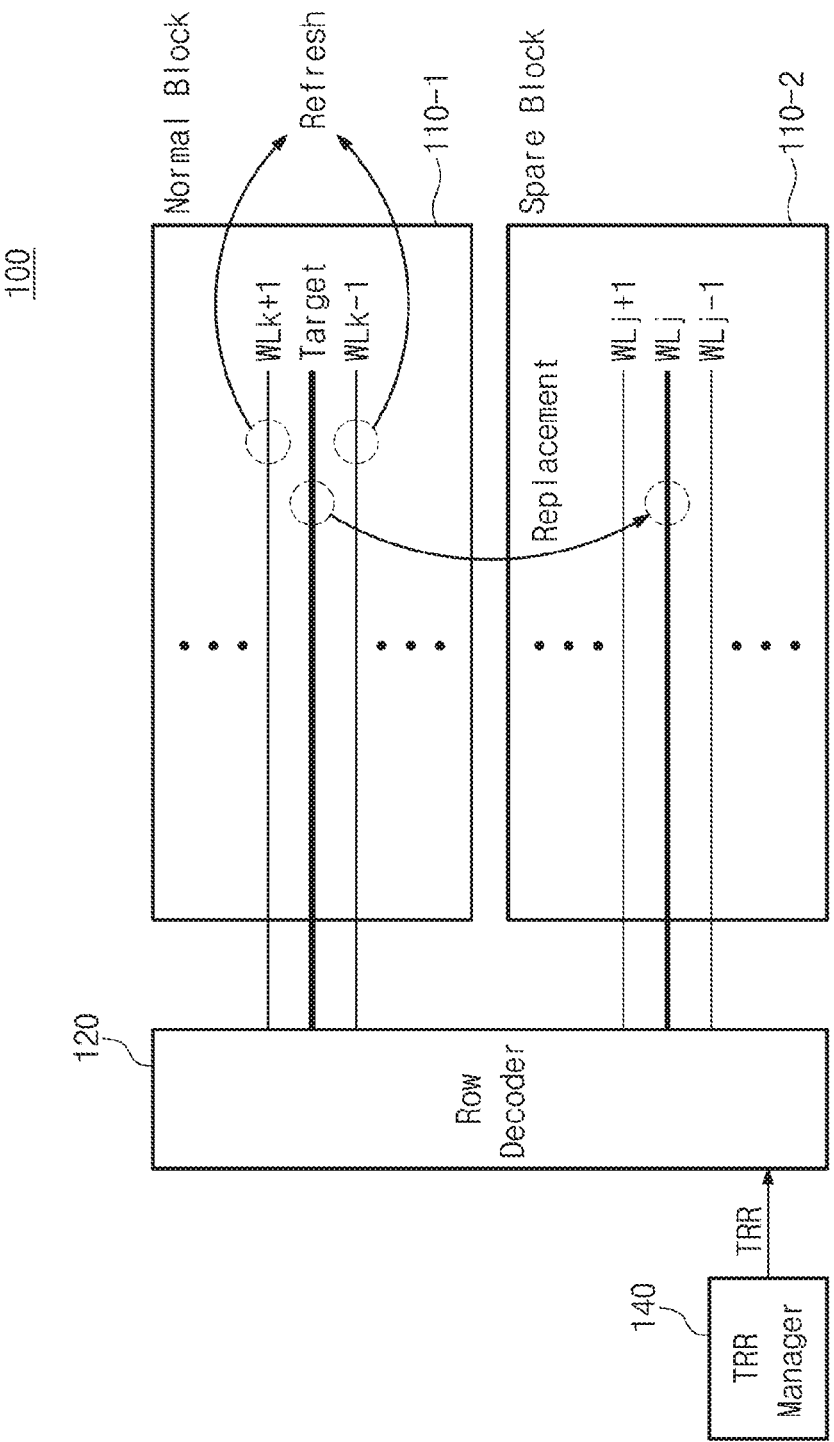
FIG. 9 is a diagram schematically illustrating a target row refresh (TRR) operation on a most frequently accessed target row address, according to another embodiment of the inventive concept.

FIG. 9 is a diagram schematically illustrating a target row refresh (TRR) operation on a most frequently accessed target row address, according to another embodiment of the inventive concept. FIG. 9 shows an operation of replacing a target row of a normal block with a row of a spare block, in addition to an embodiment described with reference to FIG. 8.

Referring to FIG. 9, a semiconductor memory 100 contains a normal block 110-1 and a spare block 110-2. For example, after there is performed a TRR operation on a word line of the normal block 110-1 corresponding to a target row, a target word line is replaced with a word line WLj of the spare block 110-2. Being a target row determined as being most frequently accessed during a reference period W, a target row is replaced with a word line of the spare block 110-2.

Figure 10:
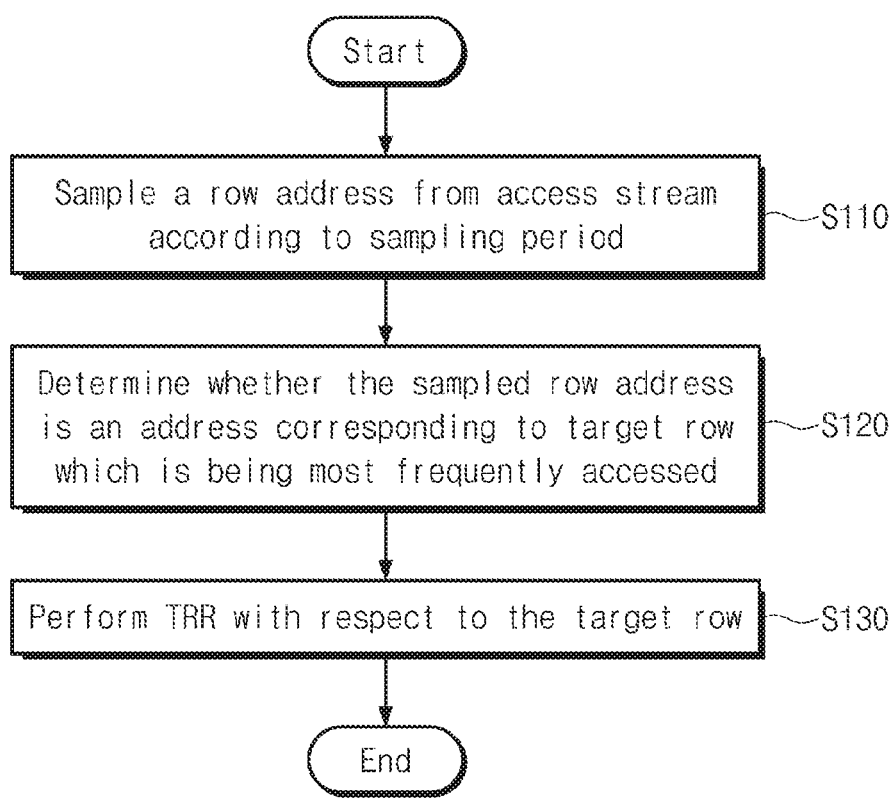
FIG. 10 is a flow chart schematically illustrating the procedure of managing a semiconductor memory, according to an embodiment of the inventive concept.

FIG. 10 is a flow chart schematically illustrating the procedure for managing a semiconductor memory, according to an embodiment of the inventive concept.

In step S110, a row address is sampled from an access stream according to a sampling period. A frequently accessed row address is not determined from all access streams received from a memory controller, but a sampling operation is performed whenever an access is requested k times. The sampling operation may be carried out at a TRR manager 140 (refer to FIG. 2) or an address buffer 130 (refer to FIG. 2).

In step S120, whether a sampled row address is an address corresponding to the most frequently accessed target row is determined. This may be made based on probability information. The sampled row address is stored in and managed by the TRR manager 140 based on the probability information.

In step S130, a TRR operation is performed with respect to a target row determined as being most frequently accessed during a reference period W. That is, word lines adjacent to a word line corresponding to a target row are refreshed, thereby making it possible to prevent row hammering of a semiconductor memory.

Figure 11:
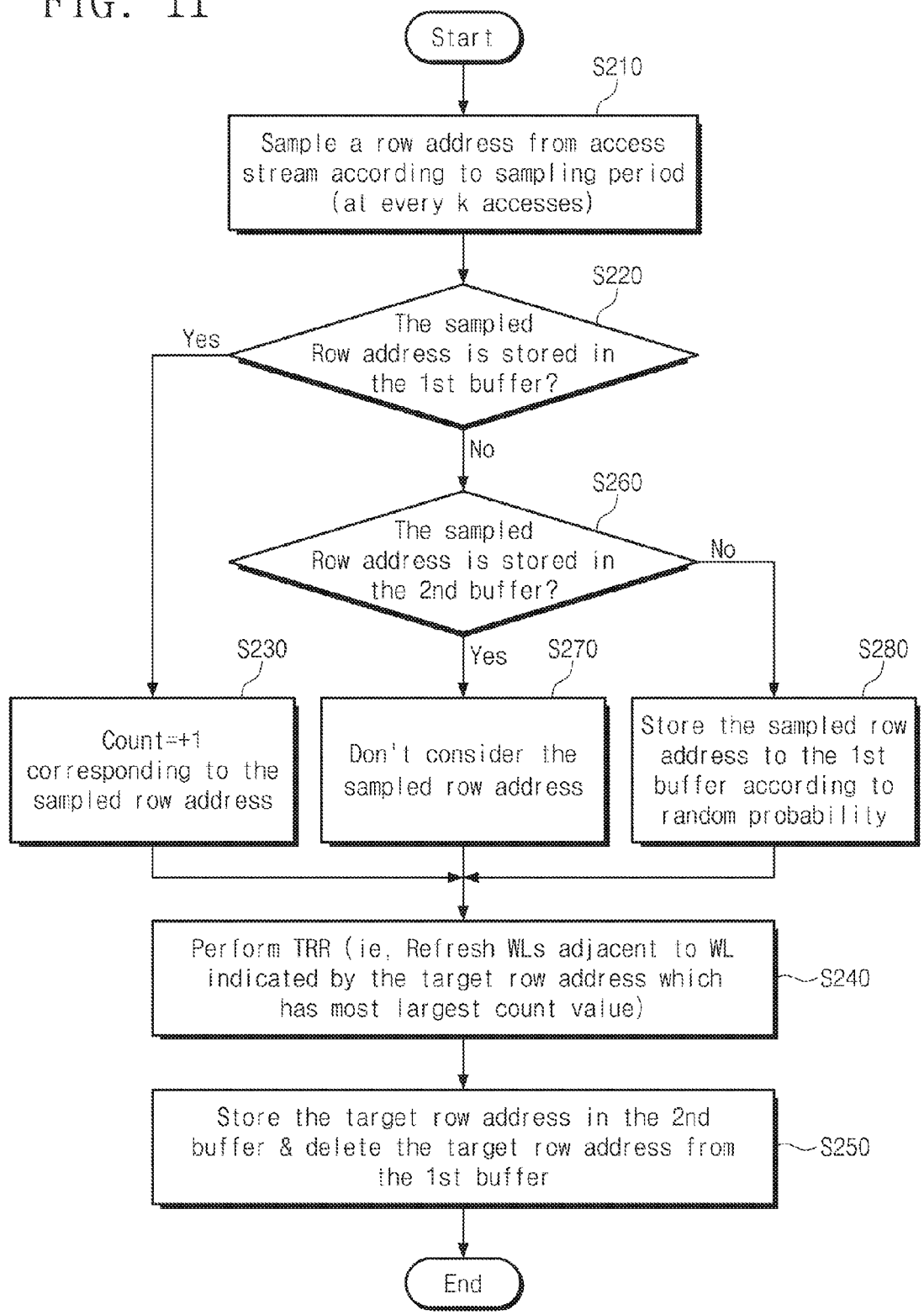
FIG. 11 is a flow chart schematically illustrating the procedure for managing a semiconductor memory, according to an embodiment of the inventive concept.

FIG. 11 is a flow chart schematically illustrating the procedure for managing a semiconductor memory, according to an embodiment of the inventive concept.

In step S210, a row address is sampled from an access stream according to a sampling period. Step 210 is the same as step S110 described with reference to FIG. 10, and a description thereof is thus omitted.

In step S220, whether the sampled row address is stored in a first buffer 146 of a TRR manager 140 is determined. If the sampled row address is stored in the first buffer 146 of the TRR manager 140, the procedure goes to step S230. If not, the procedure goes to step S260.

In step S230, a count corresponding to the sampled address increases by 1. The first buffer 146 stores address information and count information on an address to determine a frequently accessed row address.

In step S240, a TRR operation is performed with respect to a target row having the greatest count. That is, word lines adjacent to a word line corresponding to a target row are refreshed. The reason is that the probability that row hammering on word lines adjacent to a word line determined as being most frequently accessed occurs is highest.

In step S250, information associated with a target row address is stored in a second buffer 148. A target row address stored in the first buffer 146 and where the TRR operation is performed is deleted from the first buffer 146 that is used to determine a most frequently accessed target row. The reason is that there is no need to determine whether a row address is most frequently accessed, for a while, once the TRR operation is performed. A row address where the TRR operation is performed is stored in the second buffer 148 during a constant period such that it is excluded from a target. After the constant period, the row address where the TRR operation is performed is deleted from the second buffer 148 so that whether it is frequently accessed is again determined.

In step S260, whether the sampled row address is stored in the second buffer 148 is determined. If the sampled row address is stored in the second buffer 148, the procedure goes to step S270. If not, the procedure goes to step S280.

In step S270, the sampled row address is not considered during a reference period. That is, now that the sampled row address is stored in the second buffer 148 as the consequence of determining that it is most frequently accessed of late, the TRR operation is not performed with respect to the sampled row address. Only, after the reference period W or in case the oldest target row address is deleted under the condition that the second buffer 148 is full, there is again determined whether a sampled row address is most frequently accessed.

In step S280, the sampled row address is stored in the first buffer 146 according to random probability. The sampled row address may be stored in the first buffer 146 using an exemplary configuration shown in FIG. 3, 4, 5, or 6.

Figure 12:
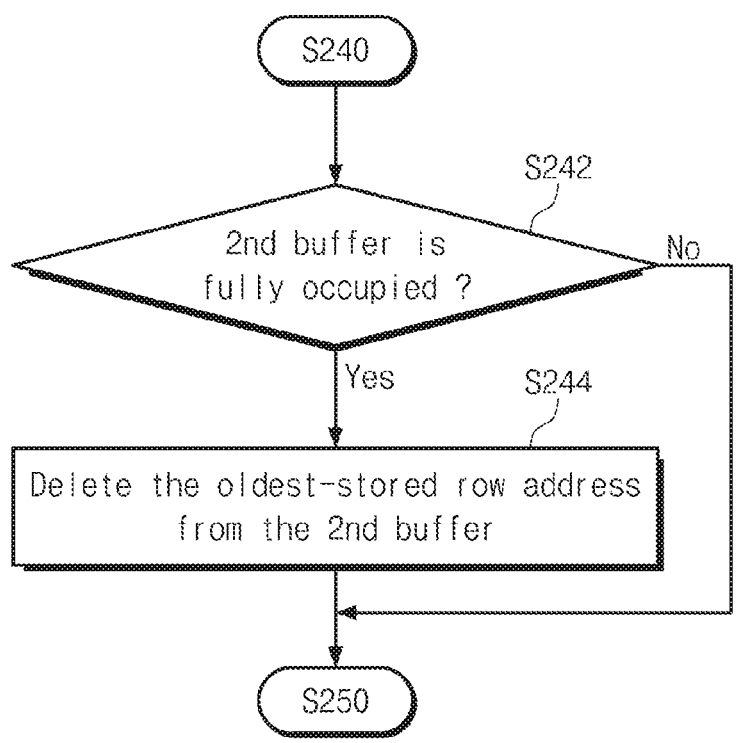
FIG. 12 is a flow chart for describing the procedure in case a second buffer is full when a sampled row address is stored in the second buffer, in step S250 shown in FIG. 11.

FIG. 12 is a flow chart for describing the procedure in case a second buffer is full when a sampled row address is stored in the second buffer, in step S250 shown in FIG. 11.

Referring to FIGS. 11 and 12, in step S242, whether a second buffer 148 is fully occupied is determined. As the consequence of determining that the second buffer 148 is full, the procedure goes to step S244. As the consequence of determining that the second buffer 148 is not full, the procedure goes to step S250 to store in the second buffer 148 information associated with a row address where a TRR operation is performed.

In step S244, deleted is information associated with the oldest target row address of row address stored in the second buffer 148. Whether or not of a frequently accessed row address is again considered with respect to the deleted target row address.

Figure 13:
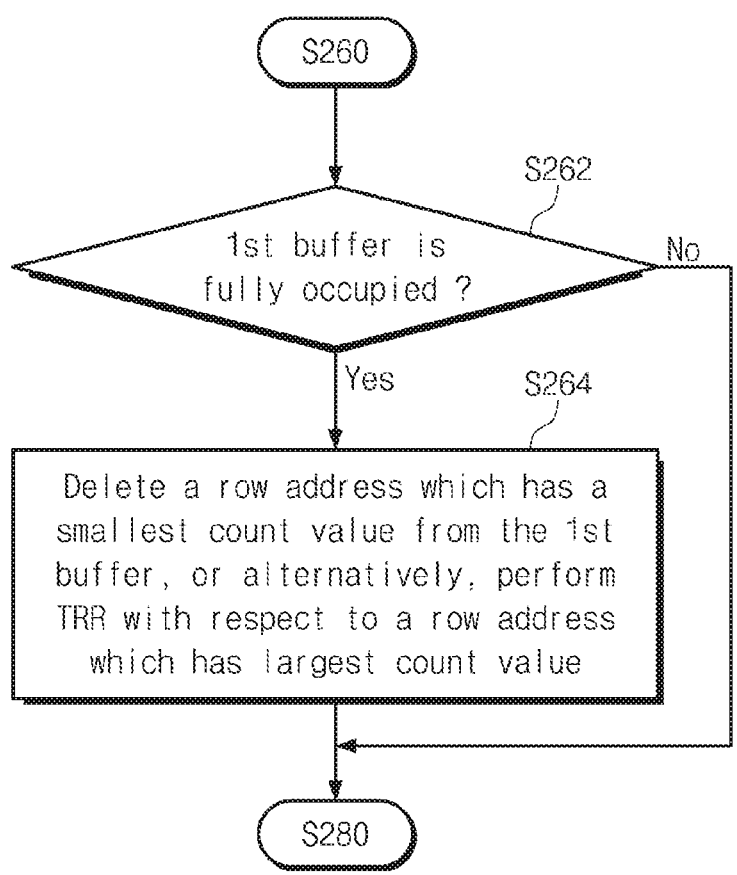
FIG. 13 is a flow chart for describing the procedure in case a first buffer is full when a sampled row address is stored in the first buffer, in step S280 shown in FIG. 11.

FIG. 13 is a flow chart for describing the procedure in case a first buffer is full when a sampled row address is stored in the first buffer, in step S280 shown in FIG. 11.

Referring to FIGS. 11 and 13, in step S262, whether a first buffer 146 is fully occupied with sampled row addresses is determined. As the consequence of determining that the first buffer 146 is fully occupied with sampled row addresses, the procedure goes to step S264. As the consequence of determining that the first buffer 146 is not fully occupied with sampled row addresses, the procedure goes to step S280.

In step S264, deleted from the first buffer 146 is information associated with a row address, having the smallest count, of row address stored in the first buffer 146. A space secured when information associated with a row address is deleted is used for a newly sampled row address.

Figure 14:
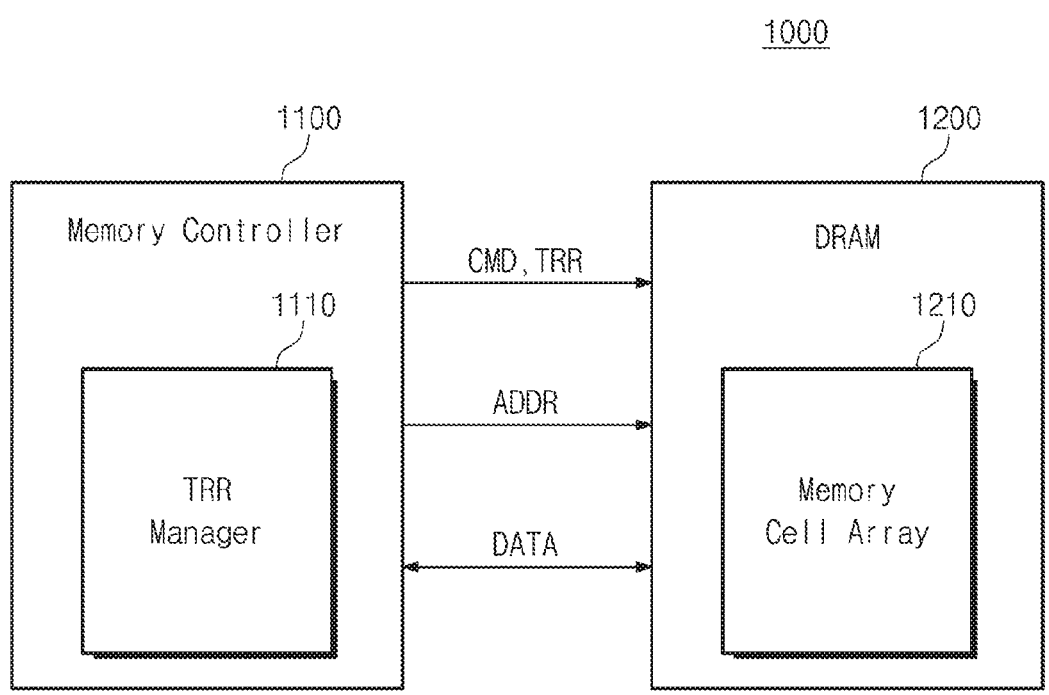
FIG. 14 is a block diagram schematically illustrating a semiconductor memory system according to another embodiment of the inventive concept.

FIG. 14 is a block diagram schematically illustrating a semiconductor memory system according to another embodiment of the inventive concept. A semiconductor memory system 1000 includes a memory controller 1100 and a DRAM 1200.

The memory controller 1100 contains a TRR manager 1110 according to an embodiment of the inventive concept. The TRR manager 1110 is configured the same as described above, and a description thereof is thus omitted.

A difference is between the cases that the memory controller 1100 includes the TRR manager 1110 and that a TRR manager is included in the DRAM 1200. For example, commands CMD that the memory controller 1100 transfers to the DRAM 1200 may not include a command for executing a refresh operation. The memory controller 1100 determines a most frequently accessed target row based on first and second buffers of the memory controller 1100. The memory controller issues a control signal TRR that enables the DRAM 1200 to perform a read operation on word lines adjacent to a word line corresponding to a target row address. In this case, the control signal TRR is a signal that is substantially the same as that used at a read operation. The same effect as a refresh operation is achieved by performing a read operation on word lines adjacent to a target row.

With an embodiment of the inventive concept, it is possible to manage a most frequently accessed row address based on probability information. All accessed addresses are not managed, but a row address is managed based on probability information, thereby making it possible to simplify algorithm and to efficiently manage a semiconductor memory with less resource. The row hammering of the DRAM is prevented by performing a TRR operation on a row address that is viewed as being most frequently accessed. Further, a method of managing a semiconductor memory is applicable to cope with a malicious code a hacker makes. For example, it is assumed that the malicious code generates an unusual access pattern on a semiconductor memory. A semiconductor memory is protected against malicious code based attack by performing a TRR operation on a row address that is most frequently accessed by the malicious code.

The inventive concept is applicable to a solid state drive (SSD).

Figure 15:
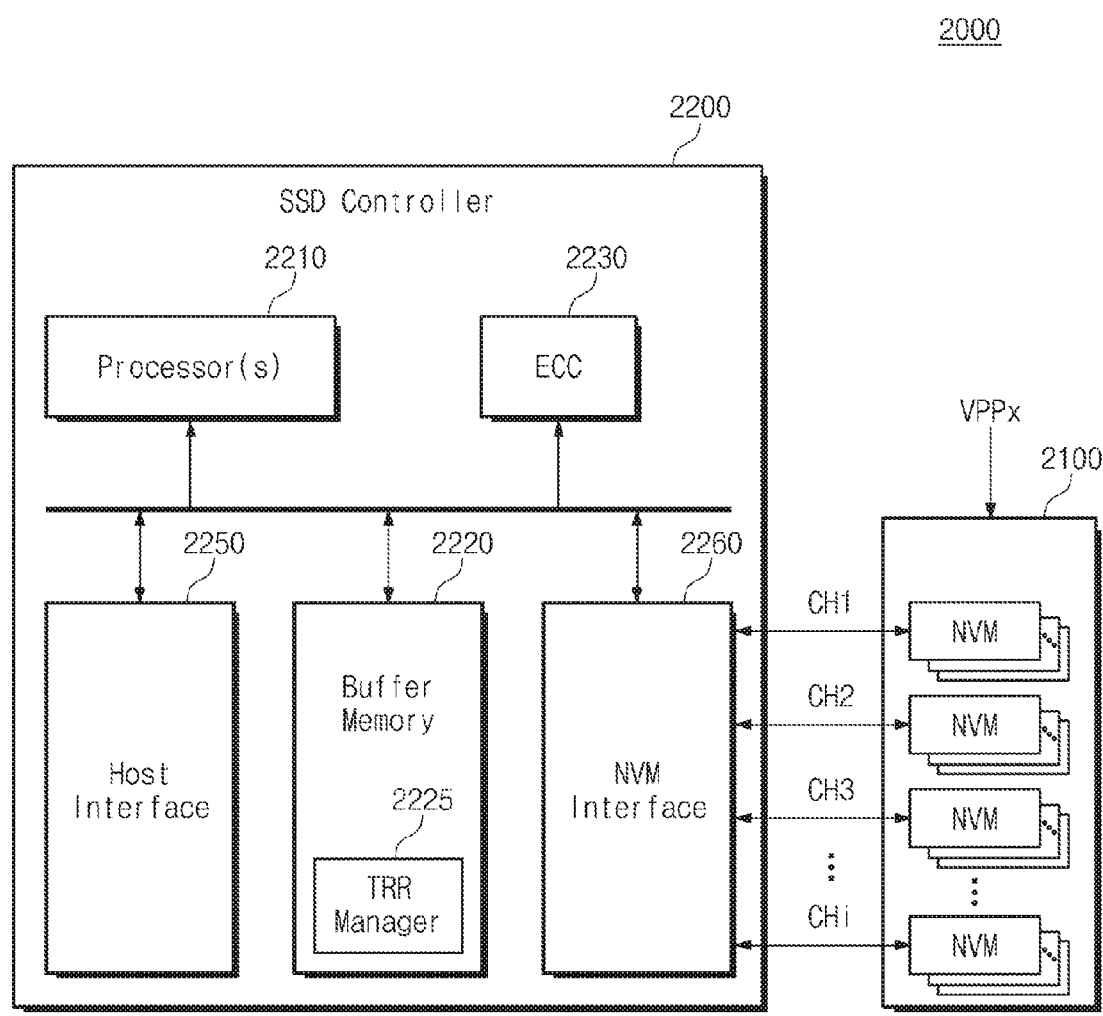
FIG. 15 is a block diagram schematically illustrating a solid state drive according to an embodiment of the inventive concept.

FIG. 15 is a block diagram schematically illustrating a solid state drive according to an embodiment of the inventive concept. Referring to FIG. 15, a solid state drive (hereinafter, referred to as SSD) 2000 includes a plurality of nonvolatile memory devices 2100 and an SSD controller 2200.

The nonvolatile memory devices 2100 may be optionally supplied with an external high voltage VPPx. The SSD controller 2200 is connected to the nonvolatile memory devices 2100 through a plurality of channels CH1 to CHi (i being an integer of 2 or more). Nonvolatile memories connected to the memory controller 2200 via the same channel are implemented in the multi-stack chip form. The SSD controller 2200 includes one or more processors 2210, a buffer memory 2220, an ECC block 2230, a host interface 2250, and a nonvolatile memory interface 2260.

The buffer memory 2220 temporarily stores data needed to drive the SSD controller 2200. The buffer memory 2220 is implemented with a DRAM including a TRR manager 2225. The buffer memory 2220 temporarily stores data to be programmed in the nonvolatile memories 2100 or data read therefrom.

The ECC block 2230 is configured to calculate an ECC value of data to be programmed at a write operation, correct an error of read data according to an ECC value at a read operation, and correct an error of data restored from the nonvolatile memory device 2100 at a data restoration operation. Although not shown in FIG. 15, a code memory may be further provided to store code data needed to drive the SSD controller 2200. The code memory may be implemented with a nonvolatile memory device.

The host interface 2250 provides an interface with an external device. The host interface 2250 may be a NAND flash interface. Besides, the host interface 2250 may be implemented with various interfaces or with a plurality of interfaces. The nonvolatile memory interface 2260 provides an interface with the nonvolatile memory devices 2100.

The SSD 2000 searches a most frequently accessed row address quickly from the buffer memory 2220 to perform a TRR operation. Thus, reliability of the SSD 2000 is improved.

Figure 16:
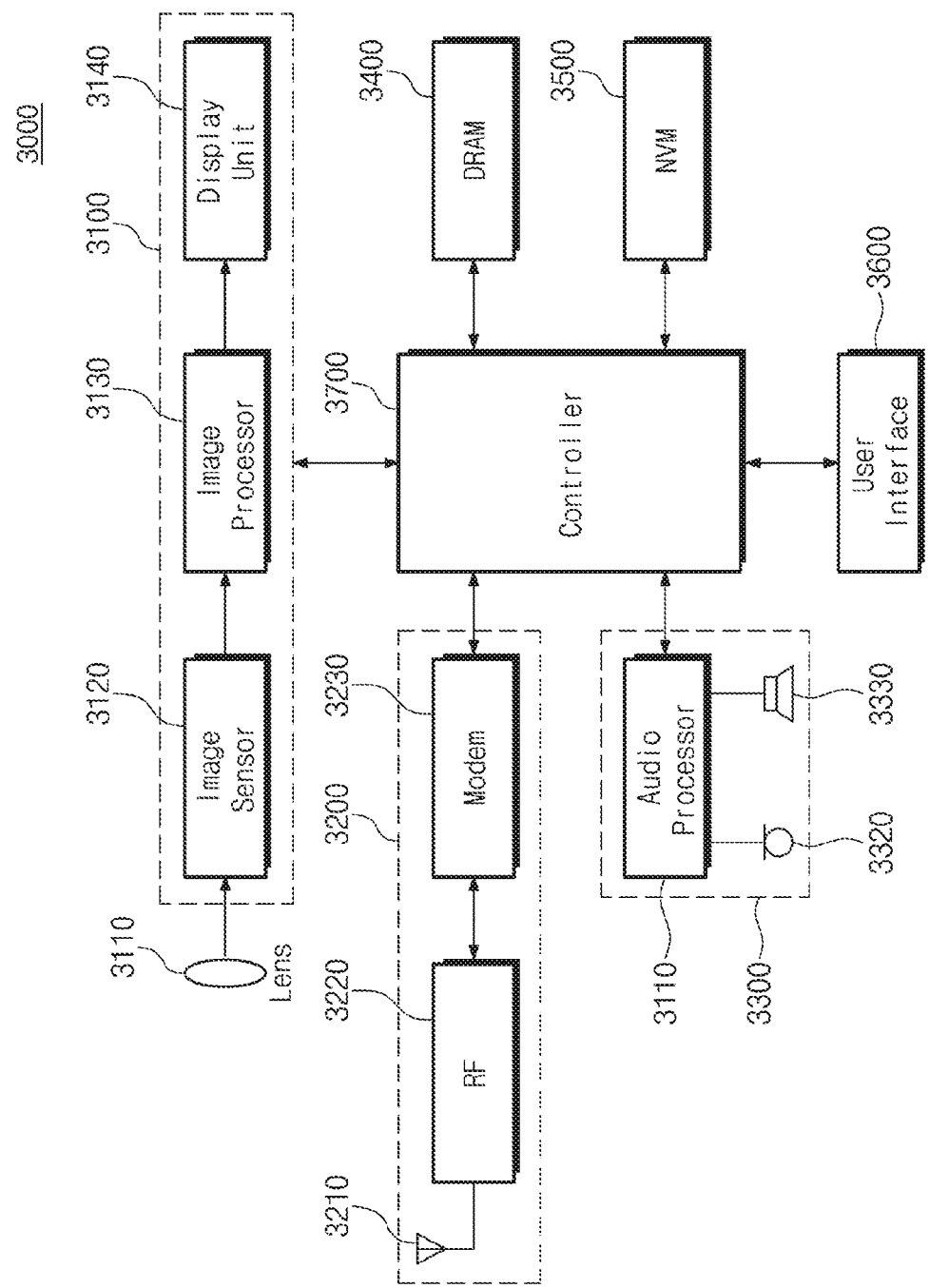
FIG. 16 is a block diagram schematically illustrating a handheld terminal according to an embodiment of the inventive concept.

FIG. 16 is a block diagram schematically illustrating a handheld terminal according to an embodiment of the inventive concept. Referring to FIG. 16, a handheld terminal 3000 according to an embodiment of the inventive concept includes an image processing unit 3100, a wireless transceiver unit 3200, an audio processing unit 3300, an image file generating unit 3400, a nonvolatile memory device 3500, a user interface 3600, and a controller 3700.

The image processing unit 3100 includes a lens 3110, an image sensor 3120, an image processor 3130, and a display unit 3140. The wireless transceiver unit 3200 includes an antenna 3210, a transceiver 3220, and a modem 3230. The audio processing unit 3300 includes an audio processor 3310, a microphone 3320, and a speaker 3330.

The DRAM 3400 temporarily stores data processed in the handheld terminal 3000. The DRAM 3400 includes a TRR manager according to an embodiment of the inventive concept which efficiently searches a frequently accessed row address and performs a TRR operation.

The nonvolatile memory device 3500 is implemented with a memory card (MMC, eMMC, SD, or micro SD). The controller 3700 is implemented with a system on chip (or, system on a chip) (SoC) that drives an application program, an operating system, and so on. The kernel of an operating system that the SoC drives includes an input/output scheduler and a device driver for controlling the nonvolatile memory device 3500. The device driver controls access performance of the nonvolatile memory device 3500 based on the number of sync queues the input/output scheduler manages, or it controls CPU mode, DVFS level, and so on associated with SoC.

A nonvolatile memory device and/or a memory controller according to an embodiment of the inventive concept may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

INDUSTRIAL APPLICABILITY

Example embodiments of the inventive concept may be applied to realize semiconductor devices.

The invention claimed is:

1. A method of managing a semiconductor memory, comprising:
   sampling a row address from an access stream on a memory cell array according to a sampling period;
   determining whether the sampled row address is an address corresponding to a target row which is most frequently accessed, based on probability information; and
   executing a refresh operation on rows adjacent to the target row.

2. The method of claim 1, wherein determining whether the sampled row address is an address corresponding to a target row which is most frequently accessed comprises:
   determining whether the sampled row address is stored in a first buffer; and
   as a consequence of determining that the sampled row address is stored in the first buffer, increasing a count corresponding to the sampled row address.

3. The method of claim 2, wherein in executing a refresh operation on rows adjacent to the target row, rows adjacent to a target row corresponding to a row address having the greatest count of counts stored in the first buffer are refreshed.

4. The method of claim 3, further comprising: as a consequence of determining that the sampled row address is not stored in the first buffer, determining whether the sampled row address is stored in a second buffer.

5. The method of claim 4, wherein as a consequence of determining that the sampled row address is stored in the second buffer, rows adjacent to a row pointed by the sampled row address is not refreshed during a reference period.

6. The method of claim 5, further comprising:
   as a consequence of determining that the sampled row address is not stored in the second buffer, storing the sampled row address in the first buffer according to reference probability.

7. The method of claim 6, wherein storing the sampled row address in the first buffer according to reference probability is performed according to a result of comparing probability generated by a random number generator and the reference probability, and wherein when the probability generated by the random number generator is higher than the reference probability, the row address is stored in the first buffer.

8. The method of claim 6, wherein if the rows adjacent to the target row are refreshed, the target row address is stored in the second buffer and is deleted from the first buffer.

9. The method of claim 8, wherein when the second buffer is fully occupied with target row addresses, an oldest one of the target row addresses stored in the second buffer is deleted.

10. The method of claim 6, wherein when the first buffer is fully occupied with sampled row addresses, a row address, having a smallest count, from among sampled row addresses stored in the first buffer is deleted or rows adjacent to a row corresponding to a row address, having a greatest count, from among the sampled row addresses stored in the first buffer are refreshed.

11. The method of claim 6, wherein rows adjacent to the target row are refreshed at a point in time when a reference period ends.

12. A semiconductor memory comprising:
    a memory cell array including a plurality of RAM cells connected to a plurality of word lines;
    an address buffer configured to receive an access stream on the memory cell array and to generate a row address based on the received access stream; and
    a target row refresh (TRR) manager configured to sample the generated row address according to a sampling period, determine whether the sampled row address is an address corresponding to a target row which is most frequently accessed based on probability information, and to execute a refresh operation on rows adjacent to the target row.

13. The semiconductor memory of claim 12, wherein the TRR manager comprises:
    a first buffer configured to store the sampled row address according to a reference probability and to store a count associated with the frequency of access to the stored row address; and
    a second buffer configured to store address information of the target row of row addresses stored in the first buffer.

14. The semiconductor memory of claim 13, wherein the TRR manager compares a probability generated by a random number generator with the reference probability, and wherein when the probability generated by the random number generator is higher than the reference probability, the TRR manager stores the sampled row address in the first buffer.

15. The semiconductor memory of claim 14, wherein the count corresponding to the sampled row address increases when the sampled row address is previously stored in the first buffer.

16. The semiconductor memory of claim 14, wherein when the sampled row address is previously stored in the second buffer, rows adjacent to a row corresponding to the sampled row address are not refreshed during a reference period.

17. A method of managing a semiconductor memory, comprising:
    sampling a row address from an access stream from a memory cell array according to a sampling period;
    determining whether the sampled row address is stored in a first buffer;

as a consequence of determining that the sampled row address is stored in the first buffer, increasing a count corresponding to the sampled row address; and refreshing rows adjacent to a target row corresponding to a row address having a greatest count of counts stored in the first buffer.

18. The method of claim 17, further comprising:

as a consequence of determining that the sampled row address is not stored in the first buffer, determining whether the sampled row address is stored in a second buffer.

19. The method of claim 18, wherein as a consequence of determining that the sampled row address is stored in the second buffer, a row of a memory cell array pointed by the sampled row address is not refreshed during a reference period.

20. The method of claim 19, further comprising:

as a consequence of determining that the sampled row address is not stored in the second buffer, storing the sampled row address in the first buffer according to reference probability.

\* \* \* \* \*